(12) United States Patent
Bach et al.

(10) Patent No.: US 9,936,304 B2
(45) Date of Patent: Apr. 3, 2018

(54) DIGITAL SILICON MICROPHONE WITH CONFIGURABLE SENSITIVITY, FREQUENCY RESPONSE AND NOISE TRANSFER FUNCTION

(71) Applicant: Infineon Technologies AG, Neubiberg (DE)

(72) Inventors: Elmar Bach, Villach (AT); Dietmar Straeussnigg, Villach (AT); Andreas Wiesbauer, Poertschach (AT)

(73) Assignee: INFINEON TECHNOLOGIES AG, Neubiberg (DE)

( * ) Notice: Subject to any disclaimer, the term of this patent is extended or adjusted under 35 U.S.C. 154(b) by 0 days.

(21) Appl. No.: 15/244,858

(22) Filed: Aug. 23, 2016

(65) Prior Publication Data
US 2018/0063644 A1 Mar. 1, 2018

(51) Int. Cl.
| | | |
|---|---|---|
| H04R 3/00 | (2006.01) | |
| H04R 19/00 | (2006.01) | |
| G10L 21/0208 | (2013.01) | |
| H04R 19/04 | (2006.01) | |
| H04R 3/04 | (2006.01) | |
| H03M 3/00 | (2006.01) | |

(52) U.S. Cl.
CPC ........ *H04R 19/005* (2013.01); *G10L 21/0208* (2013.01); *H03M 3/424* (2013.01); *H04R 3/04* (2013.01); *H04R 19/04* (2013.01)

(58) Field of Classification Search
CPC .......... H04R 1/04; H04R 1/222; H04R 1/342; H04R 3/00; H04R 3/02; H04R 3/04; H04R 3/06; H04R 19/005; H04R 19/01; H04R 19/04; H04R 2201/003; H04R 2410/00; H04R 2410/01; G10L 21/0208; H03M 3/424
USPC .................. 381/98, 111, 113, 122, 355, 365
See application file for complete search history.

(56) References Cited

U.S. PATENT DOCUMENTS

| | | | | |
|---|---|---|---|---|
| 2014/0301571 | A1* | 10/2014 | Melanson | ............. H03M 3/424 381/111 |
| 2015/0195059 | A1* | 7/2015 | Strau nigg | ........... H04B 1/0483 375/295 |
| 2016/0192084 | A1* | 6/2016 | Oliaei | .................. H04R 19/005 367/135 |

OTHER PUBLICATIONS

Elmar Bach, U.S. Appl. No. 14/516,736, filed Oct. 17, 2014, entitled "Very high dynamic-range switched capacitor ADC with large input impedance for applications tolerating increased distortion and noise at large input signal levels".

* cited by examiner

*Primary Examiner* — Matthew Eason
*Assistant Examiner* — Sabrina Diaz
(74) *Attorney, Agent, or Firm* — Slater Matsil, LLP

(57) ABSTRACT

In some embodiments, a microphone system includes a multi-bit delta-sigma modulator configured to be coupled to a microphone and configured to covert an output of the microphone into a first digital signal with a multi-bit resolution at a first output of the multi-bit delta-sigma modulator. The microphone system also includes a digital noise shaper coupled to the first output of the multi-bit delta-sigma modulator, and configured to convert a multi-bit digital input of the digital noise shaper into a one-bit digital signal.

26 Claims, 12 Drawing Sheets

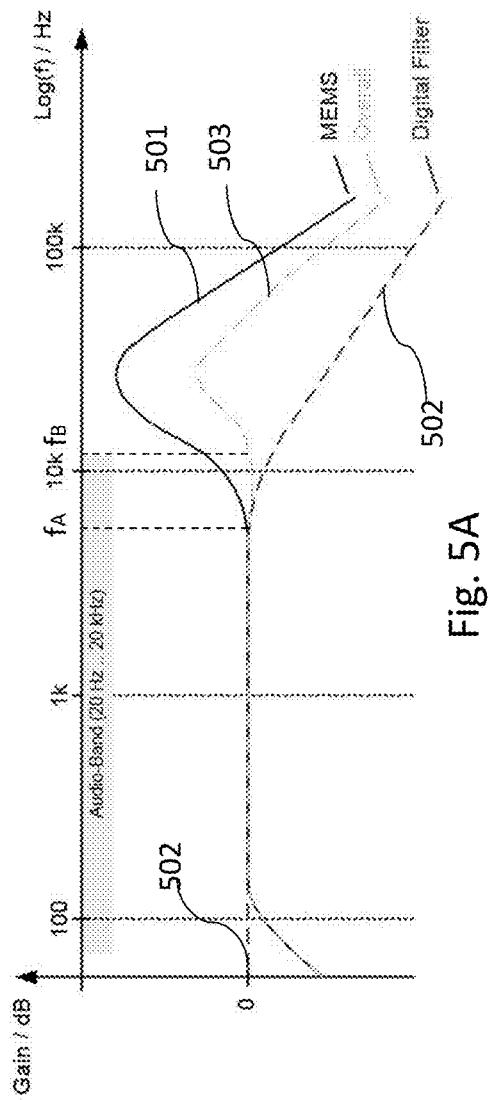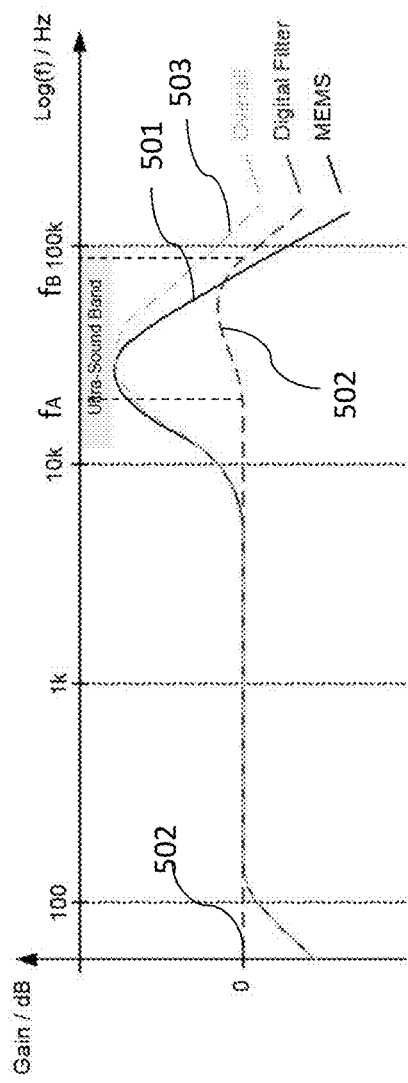
Fig. 5A
Fig. 5B

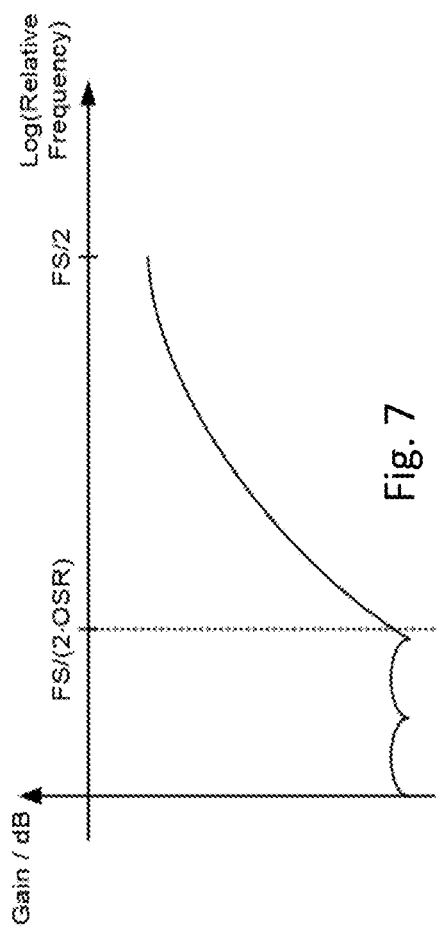
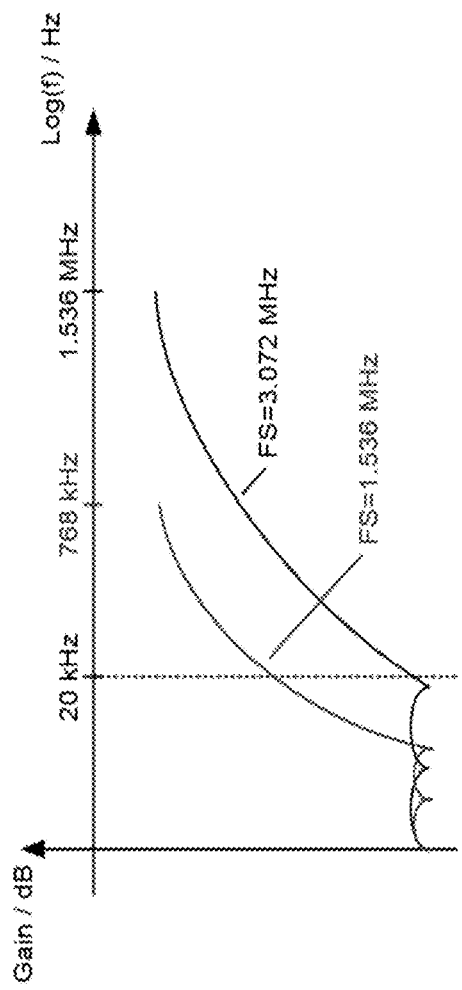

DIGITAL SILICON MICROPHONE WITH CONFIGURABLE SENSITIVITY, FREQUENCY RESPONSE AND NOISE TRANSFER FUNCTION

TECHNICAL FIELD

An embodiment of the invention relates generally to electrical circuits, and more particularly to system and method of digital silicon microphones.

BACKGROUND

The term microelectromechanical system (MEMS) is often used to refer to small integrated devices or systems that combine electrical and mechanical components. Microphones may be implemented as MEMS, e.g., small microphones comprising mechanical components such as membranes and electrical components for measuring sound pressure levels.

A MEMS microphone includes a pressure-sensitive membrane or diaphragm disposed in a silicon chip. The MEMS microphone (also referred to as MEMS sensor) may be packaged together with an amplifier. The MEMS microphone and the amplifier may be located on different chips or on the same chip. The MEMS microphone may also include an analog-to-digital converter (ADC) circuit making it a digital MEMS microphone, also referred to as a digital silicon microphone (SiMIC). Digital silicon microphones are widely used in various systems and applications such as mobile phones, laptops and other digital mobile devices.

Sensitivity requirements for digital SiMICs may vary drastically depending on the applications. High signal-to-noise ratios are expected of modern digital SiMICs. In addition to supporting audio band signal transmission, digital SiMICs may support other frequency band of operation, e.g., ultra-sound band. There is a need for high-performance digital SiMICs that can support different performance requirements and/or different frequency bands of operation.

SUMMARY OF THE INVENTION

In accordance with an embodiment, a microphone system includes a multi-bit delta-sigma modulator configured to be coupled to a microphone and configured to covert an output of the microphone into a first digital signal with a multi-bit resolution at a first output of the multi-bit delta-sigma modulator. The microphone system also includes a digital noise shaper coupled to the first output of the multi-bit delta-sigma modulator, and configured to convert a multi-bit digital input of the digital noise shaper into a one-bit digital signal.

BRIEF DESCRIPTION OF THE DRAWINGS

The details of one or more embodiments of the invention are set forth in the accompanying drawings and the description below. Other features, objects, and advantages of the invention will be apparent from the description and drawings, and from the claims. In the figures, identical reference symbols generally designate the same component parts throughout the various views, which will generally not be redescribed in the interest of brevity. For a more complete understanding of the invention, reference is now made to the following descriptions taken in conjunction with the accompanying drawings, in which:

FIGS. 5A and 5B illustrate two Bode plots representing the performance of an audio band system and an ultra-sound band system, respectively, in some embodiments;

FIG. 7 illustrates an embodiment frequency response of the noise transfer function (NTF) of digital noise shaper 230 in FIG. 3B, in some embodiments;

FIG. 8 illustrates the frequency response of the NTF in FIG. 7 with different sampling frequencies, in some embodiments;

DETAILED DESCRIPTION OF ILLUSTRATIVE EMBODIMENTS

Figure 1:
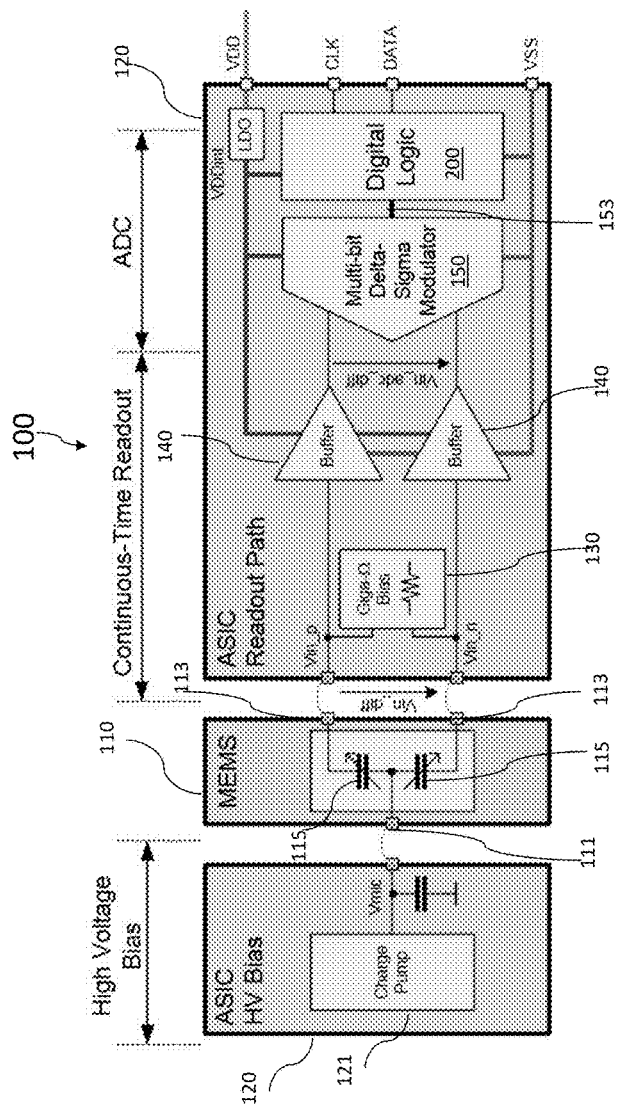
FIG. 1 illustrates a block diagram of digital silicon microphone, in some embodiments.

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

The present invention will be described with respect to exemplary embodiments in a specific context, namely converting sound signals with a large dynamic range into digital signals using a reconfigurable digital silicon microphone.

In various embodiments, a microphone system includes a multi-bit delta-sigma modulator that converts a sound signal into a first digital signal with multi-bit resolution. A reconfigurable digital filter equalizes the first digital signal and digitally adjusts the gain of the first digital signal. A reconfigurable digital noise shaper converts a multi-bit output of the digital filter into a second digital signal with one-bit resolution, and suppresses the in-band quantization noise by applying a noise transfer function (NTF) to the output of the digital noise shaper. Different configurations (e.g., coefficients, order of filter) of the digital filter and digital noise shaper allow for modification of the frequency response of the microphone systems for different performance requirements, such as microphone sensitivity, frequency band of operation, and sampling frequency. High dynamic range (e.g., 112 dB) and good SNR (e.g., 66 dB) are achieved with the embodiment microphone system.

Sensor technology has improved significantly over the recent years. A fully differential dual back plate capacitive MEMS sensor is capable of supporting high Acoustic Overload Levels (AOL) up to 140 dB sound pressure level (dBSPL) and Signal-To-Noise ratio (SNR) up to 69 dB. The AOL is defined as the sound pressure level at which a total harmonic distortion (THD) starts to exceed 10%. A common performance criterion of digital SiMIC is the sensitivity of the microphone, which is measured at a sound pressure level of 1 Pa or 94 dBSPL. Sensitivity requirements change drastically depending on the applications of the digital SiMIC. Standard microphones support a sound pressure level up to 120 dBSPL, thus having a sensitivity of −26 dB full scale (dBFS). Modern SiMICs may handle higher sound pressure levels up to 140 dBSPL, thus sensitivity range from −26 dBFS to −46 dBFS may be supported.

With the increase of the full-scale (e.g., 140 dBSPL) of the input signal, the dynamic range of the ADC should increase accordingly. For example, assuming a noise level that is at or below the typical human hearing limit of 28 dBSPL, digital SiMICs may support a dynamic range of 92 dB for a full-scale level of 120 dBSPL, or a dynamic range of 112 dB for a full-scale level of 140 dBSPL.

Within a relatively small range, e.g. +/−2 dB, the sensitivity of a MEMS sensor may be altered by adjustment of the sensor bias voltage. The small adjustment range (e.g., +/−2 dB) is due to the fact that to achieve a good overall SNR (e.g., considering ASIC noise), a MEMS sensor should be operated close to its maximum bias conditions to provide a large signal to a readout circuit at the reference level of 94 dBSPL. Therefore, the MEMS bias voltage can be fine-tuned (e.g., near the maximum bias voltage) to adjust the sensitivity within a range of a few dB, but is not suited to cope with a large sensitivity range from, e.g., −26 dBFS to −46 dBFS, which requires 20 dB of adjustment range.

Large scale sensitivity adjustments may be performed in the analog front end of the digital SiMIC by either setting the full-scale of the analog-to-digital converter (ADC) coupled to the digital SiMIC, or by adjusting the gain of the preamplifier driving the ADC, however, none of the two approaches provides a satisfying solution. Simply adjusting the gain of the preamplifier alters the relative input noise level of the ADC. For example, if the gain is reduced to allow for a larger input signal range (e.g., full-scale signal at 140 dBSPL), the voltage at the ADC input will be lowered at the reference level of 94 dBSPL, and the ADC's contribution to the noise increases. If the gain is increased, then the obtainable full-scale range is limited (e.g., smaller than 140 dBSPL), and the output noise of the preamplifier typically increases proportionally to the applied gain. On the other hand, maximizing the ADC's input signal range and mapping the input signal into this range alter the analog noise budgeting (e.g., the weighting of the noise contributors) which becomes a function of the selected preamplifier gain and is thus a function of the selected sensitivity. Present digital SiMICs are often designed with single-bit delta-sigma modulators (e.g., producing one-bit output) and may use the above approaches for large scale sensitivity adjustments. The output bit stream of the single-bit delta-sigma modulator directly codes the input signal, and the sensitivity is hard coded in the design. Therefore, different sensitivities are sometimes implemented using designs tailored to the target sensitivity.

FIG. 1 illustrates a block diagram for a digital silicon microphone (DiMIC) system 100 having a MEMS microphone 110 and a readout circuit 120. MEMS microphone 110 (also referred to as MEMS sensor 110) includes a capacitive MEMS sensor, in some embodiments. In the example of FIG. 1, MEMS microphone 110 includes a dual back plate capacitive MEMS sensor which supports differential output. Readout circuit 120 is shown as two blocks (e.g., block 120 on the left having charge pump 121 and block 120 on the right having multi-bit delta-sigma modulator 150) in FIG. 1 for illustrated purpose, in real implementation, readout circuit 120 is implemented as one circuit, in various embodiments. In an exemplary embodiment, readout circuit 120 (e.g., block 120 on the left and block 120 on the right) is implemented on a semiconductor substrate as an integrated circuit (IC), e.g., an application-specification integrated circuit (ASIC). Therefore, readout circuit 120 may also be referred to as readout ASIC 120 hereinafter, with the understanding the readout circuit 120 may also be implemented using, e.g., discrete components without departing from the spirit of the disclosure.

As illustrated in FIG. 1, readout ASIC 120 includes a charge pump 121 which provides a bias voltage to pin 111 of MEMS microphone 110. The bias voltage ranges from about 8 V to about 10 V in some embodiments, although bias voltage of other values, such as 15 V, may be possible. A high-impedance (e.g., 150 Giga Ohm) termination unit 130 is used to tap the output (e.g., a voltage) of MEMS microphone 110 at output pins 113 of MEMS capacitors 115 while maintaining constant charge on MEMS capacitors 115, in some embodiments. The differential input signal (e.g., voltage between pin Vin_p and Vin_n) are buffered by buffers 140 before being sent to a multi-bit delta-sigma modulator 150, in some embodiments. Multi-bit delta-sigma modulator 150 samples the analog signal (e.g., voltage) with a sampling frequency $F_s$ and produces a multi-bit digital stream 153 (e.g., a sequence of digital data with a multi-bit resolution), which is fed into a digital logic 200 for further processing in the digital domain, in various embodiments. The bit resolution of the multi-bit digital stream 153 is determined by various design and performance requirements, e.g., amount of quantization noise allowed and dynamic range of the SiMIC system, and may range from 2 to 6 bits, for example, 4 bits. Digital logic includes multiple processing modules which perform various digital signal processing functions such as scaling and/or equalization of the multi-bit digital stream 153, quantization noise shaping, and conversion of the multi-bit digital stream into a one-bit digital stream. The output of digital logic 200 is sent out (e.g., at pin DATA) to interface with the next processing module (not shown), e.g., a decimation filter or a voice codec host. Details of multi-bit delta-sigma modulator 150 and digital logic 200 are discussed hereinafter with references to FIGS. 2-9.

FIG. 1 shows a dual back plate capacitive MEMS microphone 110 having two capacitors 115 as an example. Skilled artisans will appreciate that MEMS microphone 110 may have one capacitor 115 if differential input is not used, in which case readout circuit 120 is adjusted accordingly to accommodate a single-ended input signal.

As illustrated in FIG. 1, the presently disclosed digital SiMIC system 100 uses a multi-bit delta-sigma modulator 150 (also referred to as analog modulator 150 or analog delta-sigma modulator 150). Multi-bit delta-sigma modulators have lower quantization noise compared to single-bit delta-sigma modulators, thus for a same quantization noise level, a multi-bit delta-sigma modulator with a lower order, e.g., $3^{rd}$ order, may be used for high input signal levels (e.g., 140 dBSPL). In contrast, a single-bit delta-sigma modulator may need a $5^{th}$ order modulator to achieve the same quantization noise level for similar high input signal dynamic range. Since stability of delta-sigma modulators may be difficult to maintain for high orders, multi-bit delta-sigma modulator 150 helps to ensures stability at high input signal levels by allowing for the use of a lower order modulator (e.g., $3^{rd}$ order). By using a high bit count (e.g., 4 bit) multi-bit architecture, multi-bit delta-sigma modulator 150 can support both high SNR and high dynamic range. For example, for an A-weighted audio-band, e.g., 20 Hz to 20 kHz, an SNR of 66 dB(A) and a dynamic range of 112 dB have been achieved for a digital SiMIC system using the presently disclosed architecture.

Figure 2:
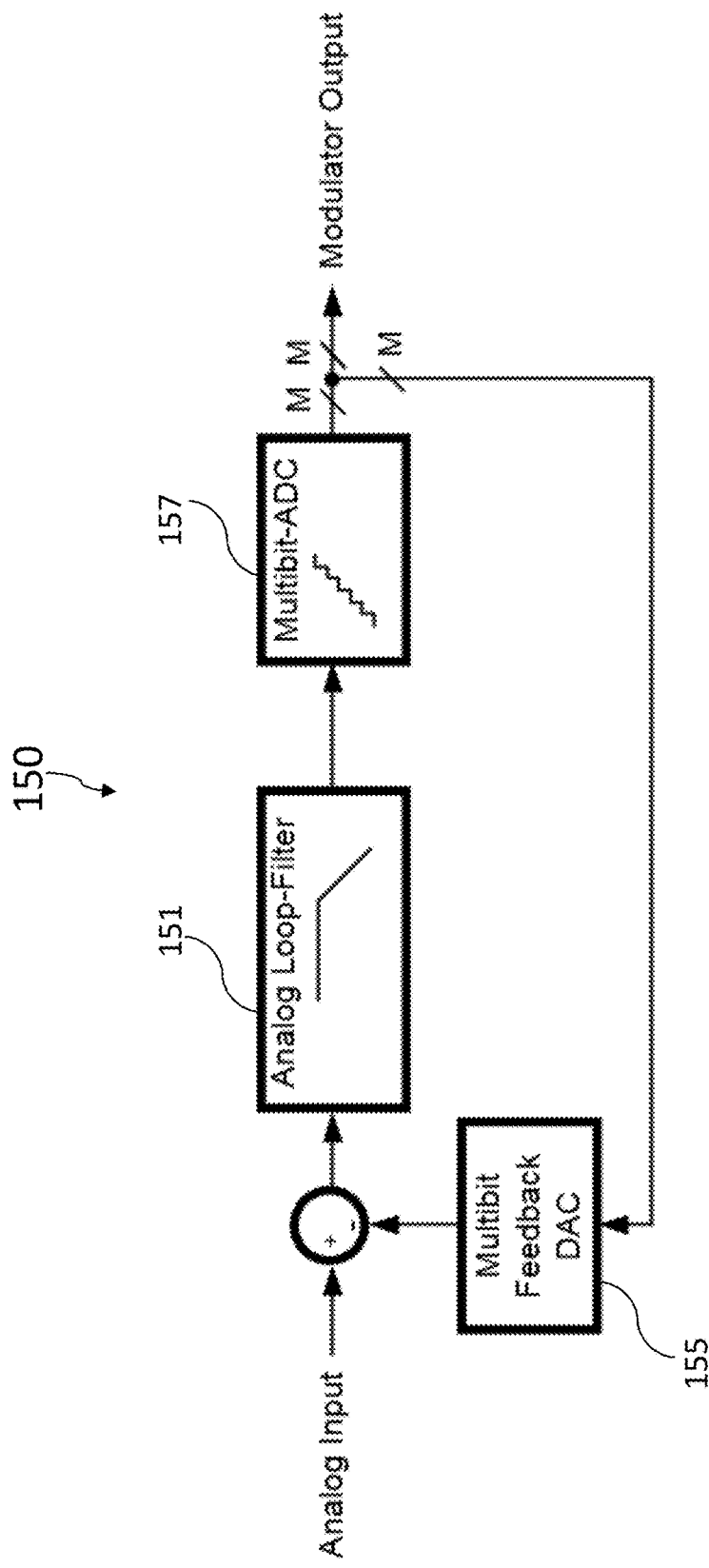
FIG. 2 illustrates a block diagram for a multi-bit delta-sigma modulator, in some embodiments.

FIG. 2 illustrates a block diagram for an embodiment multi-bit delta-sigma modulator 150. As illustrated in FIG. 2, input analog signal, after subtracting the output of multi-bit feedback digital-to-analog converter (DAC) 155, is filtered by analog loop-filter 151. The output of analog loop-filter 151 is converted by quantizer 157 into a multi-bit digital stream (e.g., a sequence of digital values with a multi-bit resolution) at the output of analog modulator 150. The M-bit digital stream is also converted back to analog signal by multi-bit feedback DAC 155 for subtracting with the analog input signal, as shown in FIG. 2.

Figure 3A:
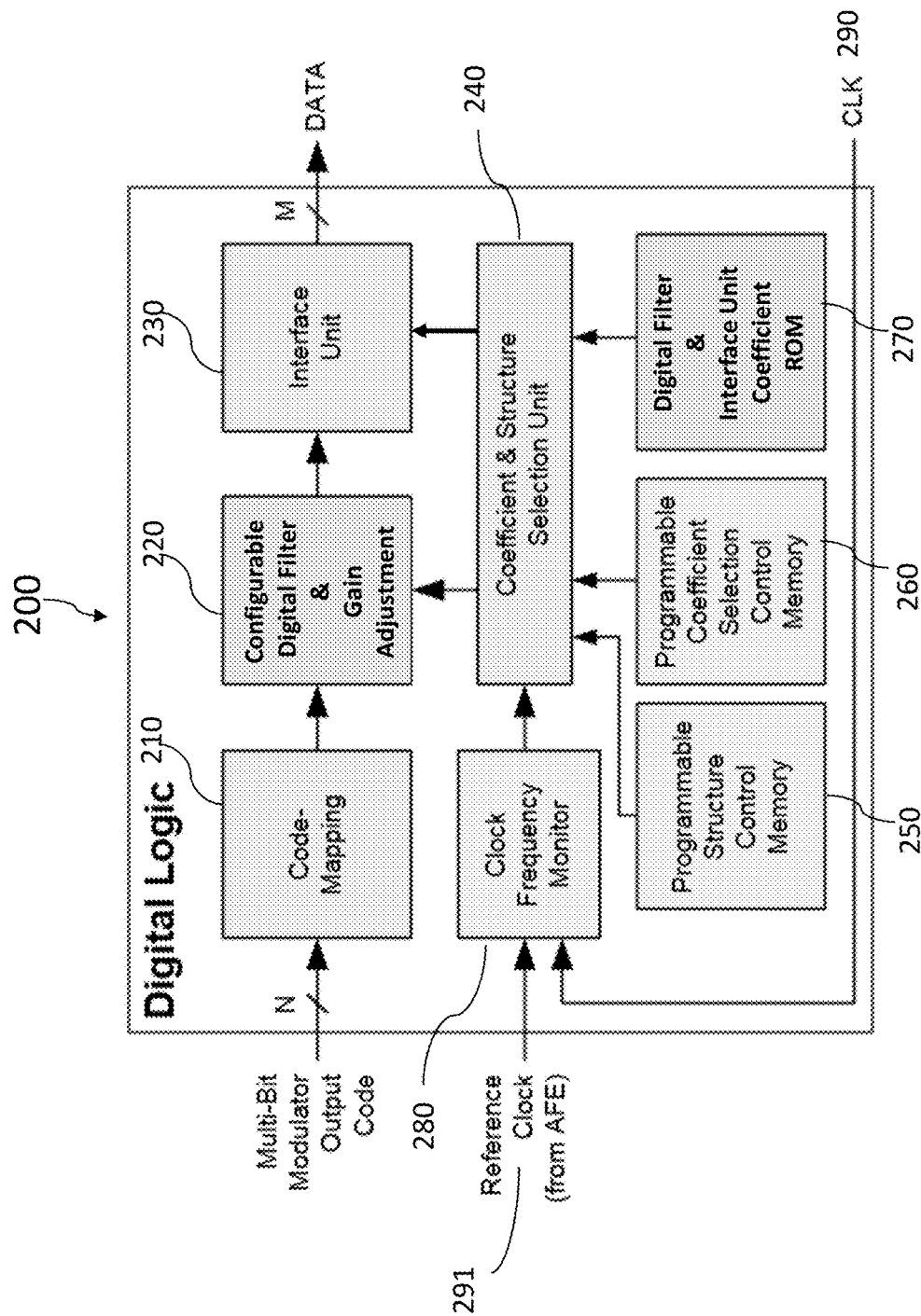
FIG. 3A illustrates a block diagram of digital logic 200 shown in FIG. 1, in some embodiments.

FIG. 3A illustrates an embodiment block diagram for digital logic 200. Digital logic 200 includes an optional code mapping module 210, a configurable digital filter and gain adjustment module 220 (also referred to as digital filter 220), and a configurable digital interface unit 230, in some embodiments. The architecture and/or coefficients of digital filter 220 and digital interface unit 230 can be modified, or re-configured. Therefore, the term "configurable" may be used interchangeably with "re-configurable" in the discussion hereinafter.

As illustrated in FIG. 3A, the coding mapping unit 210, which may be optional, converts input data format into a data format suitable for processing in digital logic 200. The output of code mapping unit 210, or the output of multi-bit delta-signal modulator 150 (see FIG. 1) when code mapping unit 210 is not present, is sent to digital filter 220 for processing. Digital filter 220 performs various signal processing function on its input data, for example, filtering (e.g., low-pass filtering), equalization, gain adjustment, and down-sampling. The output of digital filter 220 is sent to reconfigurable digital interface unit 230, which includes a reconfigurable digital logic that converts the data format of the output of digital filter 220 into a pre-determined data format at output port DATA for interfacing with subsequent modules or devices, in some embodiments. In accordance with an embodiment of the present disclosure, reconfigurable digital interface unit 230 includes a digital logic that converts the data format of the output of digital filter 220 into a pre-determined multi-bit data format, e.g., the SoundWire data format for interfacing with devices or modules having a multi-bit data interface. In another embodiment, reconfigurable digital interface unit 230 includes a digital noise shaper (e.g., a digital single-bit delta-sigma modulator) that converts the format of the output of digital filter 220 into a one-bit digital format to interface with devices or modules having a one-bit data interface, e.g., a decimation filter or an audio codec host. The structure of digital filter 220 may be adjusted in accordance with digital interface unit 230. For example, when digital interface unit 230 is a digital noise shaper, digital filter 220 may include a low-pass filter and a digital gain module; when interface unit 230 is a digital logic that supports a multi-bit output interface, digital filter 220 may include a low-pass filter, a digital gain module, and a down-sampler (e.g., for sample rate reduction). Details of digital logic 200 are discussed hereinafter. The discussion below with references to FIGS. 3C and 4A-9 is based on the embodiment in FIG. 3B, in which a digital noise shaper 230 is used as the digital interface unit 230. Skilled artisans will appreciate that the principles of the present disclosure can be readily applied to other embodiments using other types of digital interface unit 230.

Figure 3B:
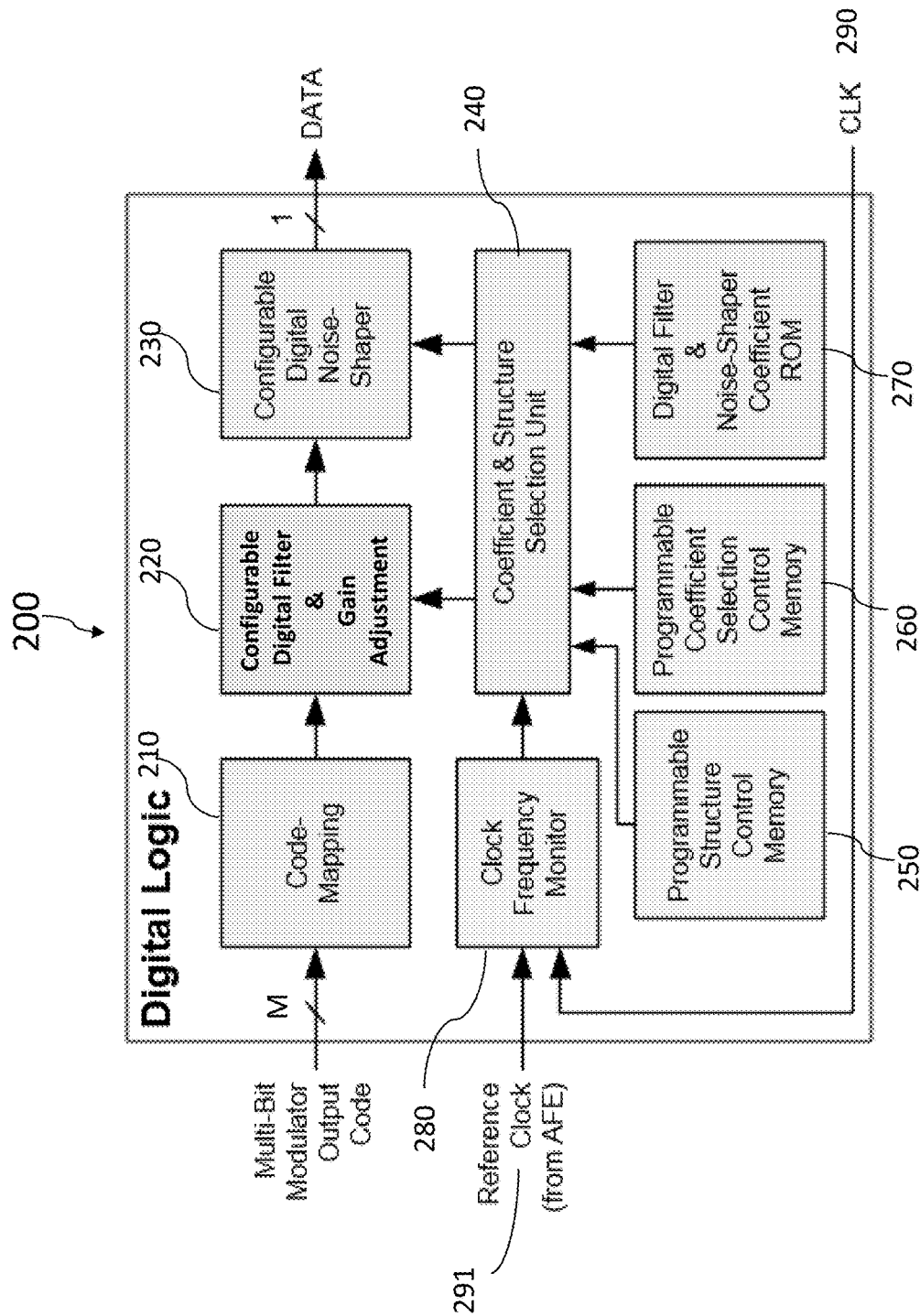
FIG. 3B illustrates another block diagram of digital logic 200 shown in FIG. 1, in some embodiments.
Figure 3C:
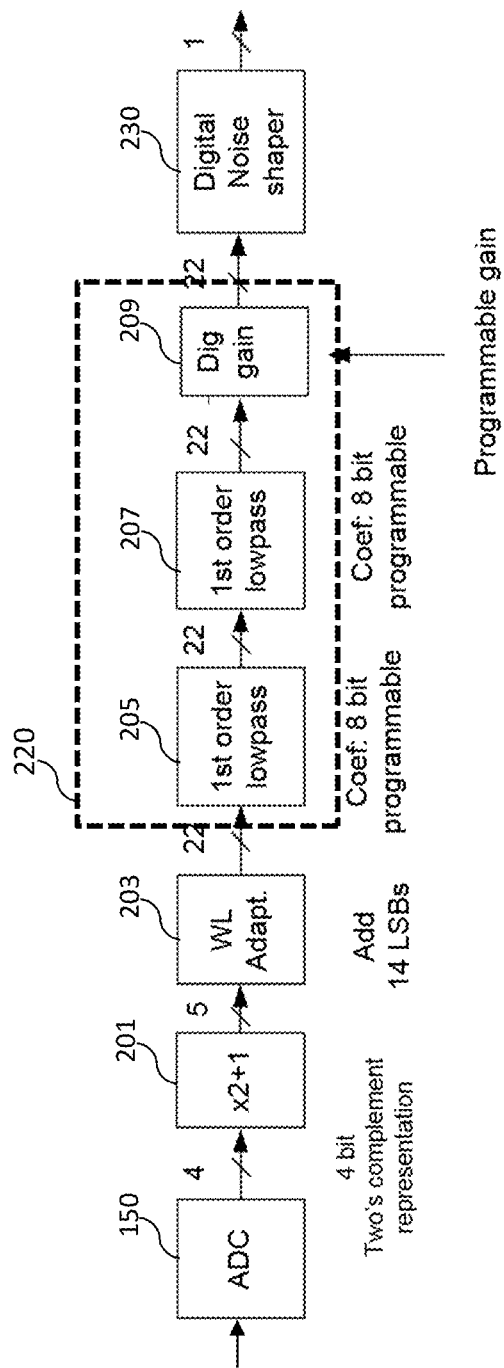
FIG. 3C illustrates a block diagram for the signal processing functional modules from the ADC to the digital noise shaper, in some embodiments.

FIG. 3C illustrates a block diagram for the signal processing functional modules from the ADC to the noise shaper. In the example of FIG. 3C, the bit resolution for the output of each functional module is labeled. For example, multi-bit delta-sigma ADC module 150 has a bit resolution of 4 at its output, which may have a two's complement data format. Functional module 201 processes the input data by shifting the input to the left by 1 bit (e.g., multiply by 2) and adding 1 to the shifted values. The output of module 201 is then processed by a word length adaptation module 203, which adds 14 least-significant bits (LSBs) to the output of functional module 201 (e.g., by shifting the output of module 201 to the left by 14 bits) and performs a sign-extension of the shifted value to form a 22-bit output, in some embodiments. Two first order low-pass filter modules, e.g., modules 205 and 207, are concatenated and filter the output of word length adaptation module 203, in some embodiments. In the example of FIG. 3C, low-pass filter modules 205 and 207 each has 8-bit coefficients that are programmable (e.g., adjustable by setting or loading a user specified value). The output of low-pass filter module 207 is scaled by a gain of digital gain module 209, which has a programmable gain, in various embodiments. Modules 205, 207 and 209 correspond to the configurable digital filter and gain adjustment module 220 in FIG. 3B, in some embodiments. The output of digital gain module 209 is then sent to digital noise shaper 230, which produces a one-bit output, in some embodiments.

Referring to FIG. 3B, optional code mapping module 210 converts the input signal (e.g., multi-bit digital stream from analog modulator 150) from a first data format (e.g., a one's complement format, or an unsigned binary format) into a second data format (e.g., a two's complement format), in some embodiments. The second data format may be a data format more suitable for signal processing, for example. Code mapping module 210 isolates the data format of the analog modulator (e.g., analog modulator 150) from the data format of the remaining processing modules of digital logic 200, thereby allowing the flexibility to choose analog modulator independently from the digital modules (e.g., digital filter 220 and digital noise shaper 230), in various embodiments. An example of the advantages provided by the code mapping module 210 is the ability to reuse existing digital logic 200 with different analog modulators having non-matching output data format, with the code mapping module 210 converting data format of the analog modulator into the data format of digital logic 200, thus increasing design reuse and reducing development cycle.

Figure 4A:
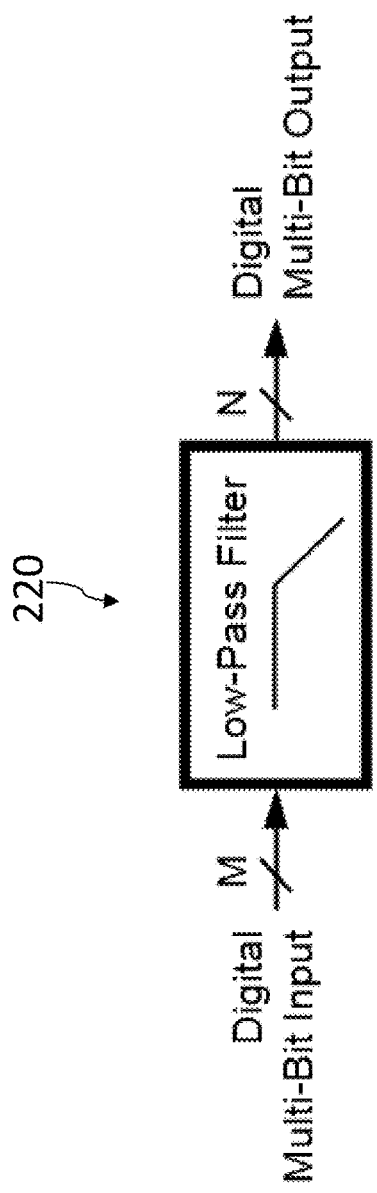
FIGS. 4A and 4B illustrate two block diagrams for digital filter 220 in FIG. 3B, in some embodiments.
Figure 4B:
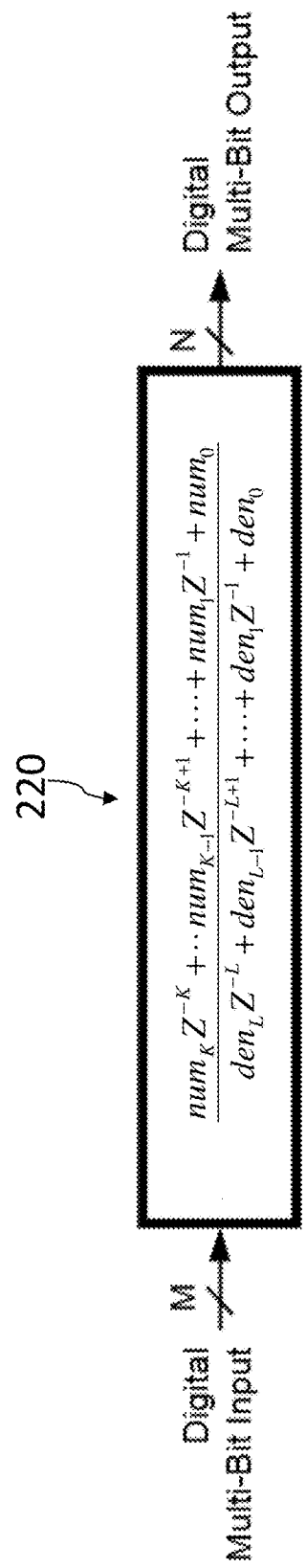

FIGS. 4A and 4B illustrate two embodiment digital filters 220. FIG. 4A shows a digital filter 220 as a low-pass filter (LPF). Skilled artisans will appreciate that an LPF may have a finite impulse response (FIR) structure or an infinite impulse response (IIR) structure. The M-bit digital input is filtered by the LPF, and output of the LPF is a digital signal with N-bit resolution. N may be the same as or different from M, in various embodiments.

FIG. 4B shows the transfer function of digital filter 220 as a generic polynomial of $Z^{-1}$. Digital filter 220 in FIG. 4B generally has an IIR structure, however, when the coefficients of the denominator $den_l$, $l=1, 2, \ldots, L$ are zero and $den_o$ is none-zero, digital filter 220 has an FIR structure. Different filter architectures can be used to implement the transfer function shown in FIG. 4B. By designing the coefficients $num_k$, $k=1, 2, \ldots, K$ and $den_l$, $l=1, 2, \ldots, L$ according to desired performance criteria, different filter characteristics may be obtained. For a re-configurable digital filter 220, the coefficients $num_k$ and $den_l$ can be set to different values to achieve different filter characteristics. In addition, the order of the digital filter 220, determined by K and L, may also be reconfigurable (e.g., can be set to different values). Similar to FIG. 4A, digital filter 220 in FIG. 4B filters the multi-bit digital input (e.g., M-bit input) and generates an output with N-bit resolution, in some embodiments. M may be different from or the same as N. Note that in FIGS. 4A and 4B, a digital gain module (e.g., digital gain module 209 in FIG. 3C) is not explicitly illustrated but is included in digital filter 220. Skilled artisans will appreciate that the function of digital gain module 209 may be implemented by, e.g., scaling the numerator coefficients of the digital filters 220 by a gain factor. In other embodiments, the function of digital gain module 209 is implemented as a gain module (e.g., a multiplier) coupled to a filter, as shown in FIG. 3C.

FIG. 5A is a Bode plot illustrating the equalization of an audio frequency band using digital filter 220. Curve 501 illustrates an embodiment frequency response of the analog channel including MEMS sensor 110 and multi-bit delta-sigma modulator 150. Curve 502 illustrates an embodiment frequency response of digital filter 220, and curve 503 illustrates the overall frequency response after the analog channel is equalized by digital filter 220 (e.g., by combining the frequency response of curves 501 and 502).

The frequency response of the analog channel is dominated by MEMS sensor 110 and is typically adjusted for audio band (e.g., frequencies between about 20 Hz and about 20 kHz) signal transfer with a reasonably flat transfer function. Mechanical properties of the microphone package may affect the frequency response. As illustrated by curve 501, a high-pass behavior is present at lower corner frequencies (e.g., about 35 Hz to about 100 Hz) of the audio band, and a resonator boost (e.g., an increase in the gain of the frequency response) is present at frequencies of about 25 kHz, in some embodiments. At input frequencies exceeding about 50 kHz, the analog channel exhibits a low-pass behavior, in some embodiments.

Still referring to FIG. 5A, digital filter 220 equalizes the frequency response of the analog channel by compensating or modifying the frequency response of the analog channel. For example, digital filter 220 may filter or equalize its input signal by applying a first gain at a first frequency and a second gain different from the first gain at a second frequency. The frequency response of digital filter 220 is frequency-selective (e.g., having non-uniform gains in a band of interest, see curve 502), thus able to enhance signal components at certain frequencies while attenuating signal components at certain other frequencies, in some embodiments. In other embodiments, the frequency response of digital filter 220 is substantially flat (e.g., substantially constant) across a band of interest, in which case digital filter 220 provides a constant gain for all signal components in the band of interest. By scaling the numerator coefficients of digital filter 220 (e.g., multiplying all coefficients of the numerator with a scale factor), curve 502 can be moved up and down along the y-axis, thus providing both gain adjustment and equalization of the analog channel. In other embodiments, gain adjustment may be obtained by placing a digital gain adjustment block in series to the filter, as shown in FIG. 3C.

In the example of FIG. 5A, digital filter 220 exhibits a low-pass behavior. In particular, digital filter 220 provides a substantially flat gain (e.g., 0 dB) from zero frequency to frequency $f_A$ (e.g., around 7 kHz), and attenuates frequency components above $f_A$. The frequency response of the overall channel, which includes the frequency response of the analog channel (e.g., curve 510) and the frequency response of digital filter 220 (e.g., curve 502), is illustrated by curve 503. Compared with the original analog channel response curve 501, curve 503 provides a substantially flat response for a wider frequency range within the audio band, for example, up to frequency $f_B$ (e.g., around 20 kHz), thus preventing or reducing attenuation of signals within the band of interest (e.g., audio band). Curve 503 also reduces the resonator boost around 25 kHz and provides more attenuation for frequency components above the higher end (e.g., 20 kHz) of the audio band, thereby reducing out-of-band noises and interferences, resulting in a cleaner audio signal with better SNR.

Due to the low-pass characteristics, digital filter 220 significantly reduces quantization noise of analog delta-sigma modulator 150. Skilled artisans will readily appreciate that due to the noise shaping effect of delta-sigma modulator 150, quantization noise level (e.g., spectrum of quantization noise) at lower frequencies (e.g., the audio band) is low, and quantization noise level increases with frequency and could be much higher at higher frequencies above the audio band. By filtering out (e.g., attenuating) frequency components above the audio band, digital filter 220 removes most of the modulator quantization noise from the output of digital filter 220, thus significantly improving the SNR of the audio signal.

In accordance with an embodiment of the present disclosure, numerator coefficients of digital filter 220 are scaled (e.g., all coefficients are scaled by a scaling factor) to provide gain adjustment for different sensitivity requirements of digital SiMICs. For example, different sets of coefficients for digital filter 220 may be pre-computed for different sensitivity scaling (also referred to as gain adjustment) and stored in a read-only memory (ROM) (see ROM 270 in FIG. 3B), and coefficients with the desired gain adjustment can be loaded into digital filter 220 for a corresponding sensitivity requirement. In some embodiments, the same type of digital SiMICs are used in different systems with different sensitivity requirements, with coefficients having the desired amount of gain adjustment loaded into digital filter 220. In other embodiments, by loading different sets of coefficients into digital filter 220, the same digital SiMIC in a digital SiMIC system can support different sensitivity requirements at different time. The re-configurability of digital filter 220 allows the same digital SiMIC to support different sensitivity requirements without redesigning the hardware.

In accordance with some embodiments, sensitivity scaling is performed fully in the digital domain, and the analog front end (AFE), including the MEMS sensor (e.g., MEMS sensor 110), MEMS interface circuit and ADC modulator (e.g., analog modulator 150), remain the same for different microphone sensitivity requirements. Since gain adjustment and filtering are applied to the output of the AFE, the SNR at the input of the digital filter 220 is independent of the selected microphone sensitivity. In some embodiments, proper choice for the word width of digital filter 220 and aggressive design of digital noise-shaper 230 may ensure that the added quantization noise of these digital modules does not affect the overall system SNR at higher over sampling rate (OSR), and may only slightly deteriorate the overall SNR at low OSR.

For ultra-sound applications, digital SiMICs supports ultra-sound signals in a frequency range between about 20 kHz and about 100 kHz. The frequency roll-off of MEMS sensor 110 above about 50 kHz (see curve 501) attenuates ultra-sound signals, in some embodiments. Advanced digital SiMICs in the present disclosure compensates that attenuation using digital filter 220, in some embodiments.

FIG. 5B illustrates the equalization of a ultra-sound frequency band using digital filter 220. Curve 501 illustrates an embodiment frequency response of the analog channel including MEMS sensor 110 and multi-bit delta-sigma modulator 150, similar to curve 501 in FIG. 5A. Curve 502 illustrates an embodiment frequency response of digital filter 220, and curve 503 illustrates the overall frequency response after the frequency response of the analog channel is equalized by digital filter 220.

As illustrated by curve 502 in FIG. 5B, configuration (e.g., order of filter, and filter coefficients) of digital filter 220 is set to provide a substantially constant gain of 0 dB up to frequency $f_A$ ($f_A$>10 kHz), and a gain larger than 0 dB between frequencies $f_A$ and $f_B$, with $f_B$ close to 100 kHz. In particular, a resonator boost is provided above the higher end of the audio band (e.g., around 25 kHz). For frequencies above about 100 kHz, digital filter 220 exhibits a low-pass characteristics. The overall frequency response curve 503 shows less attenuation in the ultra-sound band and a wider pass band compared with the original analog channel frequency response curve 501. Since the roll-off in the frequency response of the analog channel is counteracted by digital filter 220, signal levels are better maintained over the ultra-sound frequency band (e.g., about 20 kHz to about 100 kHz), which enables high SNR at the output of digital filter 220 in ultra-sound applications. Similar to the discussion of FIG. 5A, digital filter 220 used in FIG. 5B attenuates frequency components above the band of interest (e.g., the ultra-sound band), resulting in smaller quantization noise and improved SNR.

FIGS. 5A and 5B are merely examples. The coefficients and order of digital filter 220 can be modified in other ways to provide various frequency responses for performance improvement, as skilled artisans readily appreciate. In some embodiments, once coefficients are loaded into digital filter 220, the coefficients remain unchanged during operation until new coefficients are loaded. In other embodiments, coefficients of digital filter 220 may be updated as new digital samples from analog modulator 150 enter digital filter 220. Therefore, digital filter 220 may operate as an adaptive filter or adaptive equalizer to dynamically track and/or compensate changes in the analog channel.

Figure 6A:
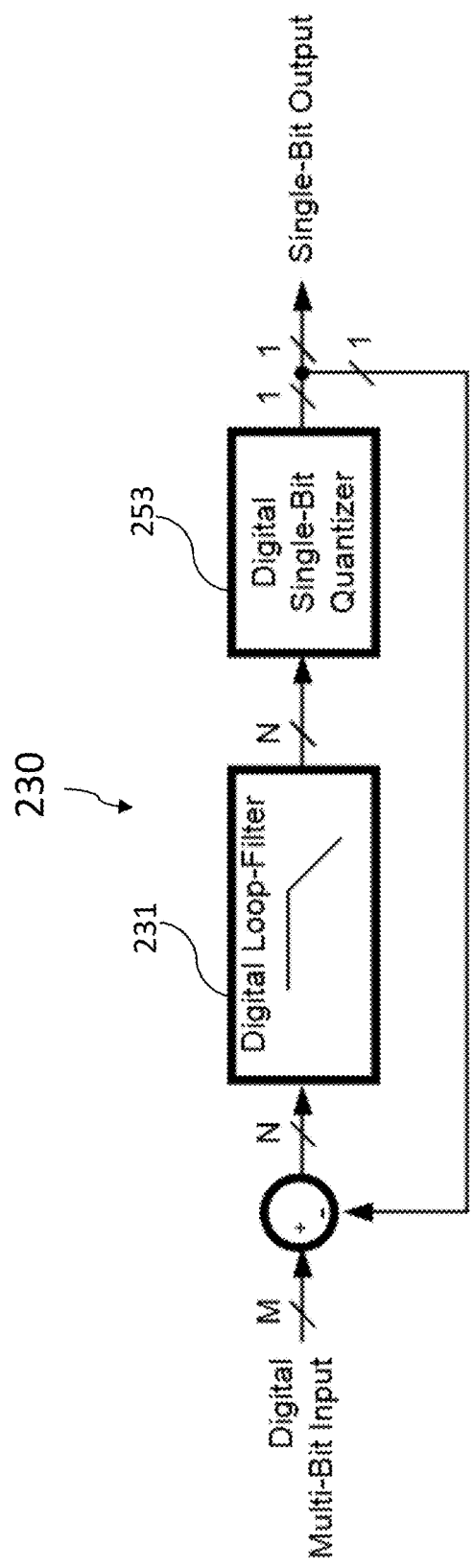
FIGS. 6A and 6B illustrate two embodiment block diagrams of digital noise shaper 230 in FIG. 3B, in some embodiments.

FIG. 6A illustrates an embodiment block diagram for digital noise shaper 230. Digital noise shaper 230 includes a digital loop filter 231, a digital single-bit quantizer 253 and a feedback path from the digital single-bit quantizer 253 to a subtractor at the input of digital noise shaper 230, in some embodiments. Digital noise shaper 230 converts a multi-bit digital input signal into a single-bit digital output, thus is also referred to as digital modulator 230, in some embodiments. In accordance with an exemplary embodiment, digital noise shaper 230 is a digital one-bit delta-sigma modulator that produces a one-bit output signal. The data word length of the output (e.g., one-bit output) of digital noise shaper 230 is lower than the data word length of the input (e.g., multi-bit data from digital filter 220) of digital noise shaper 230, in various embodiments.

Figure 6B:
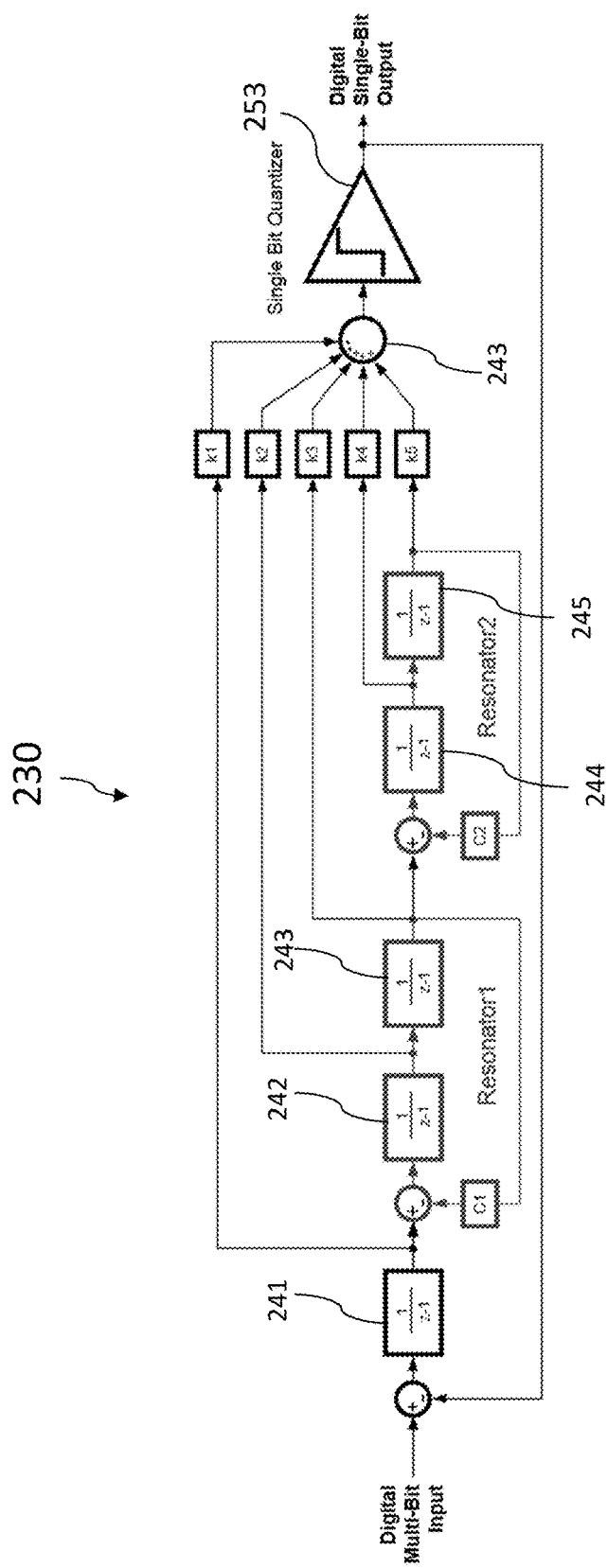

FIG. 6B illustrates another embodiment block diagram for digital noise shaper 230. In the example of FIG. 6B, a fifth order digital noise shaper is used to achieve a high dynamic range, which includes two second order low pass stages (e.g., resonator1 and resonator 2, see labels in FIG. 6B) and a first order low pass stage (e.g., integrator 241). Resonator 1 includes integrators 242 and 243, and resonator 2 includes integrators 244 and 245, in some embodiments. As illustrated in FIG. 6B, output of the five integrators 241/242/243/244/245 are scaled by different coefficients (e.g., $K_1$, $K_2$, ..., $K_5$) before being added by an summation unit 243. The coefficients (e.g., $K_1$, $K_2$, ..., $K_5$) may be programmable (e.g., could be modified) by user settings. The output of summation unit 243 is sent to single bit quantizer 253, which produces the one-bit output digital data. The order of digital noise shaper 230 is programmable, thus may be higher or lower than five in other embodiments. The order of digital noise shaper 230 may be made programmable by, e.g., adding digital logics such as multiplexers (MUX) (not shown) that receives multiple input and outputs a subset (e.g., one) of the multiple input as output. Skilled artisans will readily appreciate that MUXes can be added to FIG. 6B to by-pass certain integrators (e.g., integrators 242 and 243, and/or integrators 244 and 245) to modify the order of digital noise shaper 230, which, in combination with programmable coefficients (e.g., $K_1$, $K_2$, ..., $K_5$, and $C_1$ and $C_2$), offer flexibility in adjusting the performance of digital noise shaper 230. The complex poles of the transfer function of the resonator stages result in notches in the noise transfer function, and are placed in-band or at the upper end of the signal band to optimize noise suppression, in some embodiments. For example, feedback coefficients $C_1$ and $C_2$ of the resonators (e.g., resonator1 and resonator 2) may be changed to modify the location of the complex poles of the transfer function. The out-of-band behavior of noise shaper 230 is determined by the order of the digital noise shaper, in accordance with some embodiments.

FIG. 7 illustrates an embodiment noise transfer function (NTF) of digital noise shaper 230. As noted above, digital noise shaper 230 is re-configurable, such that the order and coefficients of digital loop filter 231 can be modified to ensure stability of digital noise shaper 230 while achieving a desired level of SNR for the output of digital noise shaper 230, in accordance with some embodiments. Since digital filter 220 already attenuates the noise-shaped quantization noise of the analog modulator at higher frequencies (e.g., frequencies above the band of interest), digital noise shaper 230 is less critical to become instable as the signal power of high frequency input signal components is sufficiently attenuated thereby avoiding overload of the noise shaper. As another advantage of having digital filter 220, digital noise shaper 230 can be designed much more aggressively (since it is a digital filter with stable coefficients), to achieve good quantization noise performance while supporting a high dynamic range. For example, at high filter orders, e.g. 5th order digital noise shaper 230, a dynamic range of 112 dB can be achieved.

As illustrated in FIG. 7, the NTF of digital noise shaper 230 exhibits a high attenuation within a low frequency band (e.g., zero frequency to $F_s/(2 \times OSR)$), and lower attenuation outside the low frequency band. In some embodiments, resonator poles are positioned in the low frequency band to optimize or improve the performance of digital noise shaper 230. Digital noise shaper 230 performs noise shaping for the quantization noise, such that quantization noise level is low in the low frequency band (e.g., a band of interest), and quantization noise level is high in higher frequencies beyond the low frequency band.

Referring to FIG. 3B, the reconfiguration of digital filter 220 and digital noise shaper 230 are performed by a coefficient and structure selection unit 240, in some embodiments. Coefficient and structure selection unit 240 sets the structure of digital filter 220 and digital noise shaper 230 in accordance with settings of one or more control bits in a programmable structure control memory 250, in various embodiments. System requirements, such as the dynamic range and SNR, may require structural adjustments of digital logic 200. For example, the order of digital filter 220 and/or the order of digital noise shaper 230 may be modified (e.g., increased or reduced) in response to a different system performance requirement. Furthermore, power requirements differ depending on the operating mode, e.g. high-performance mode or low-power mode. It is therefore advantageous to have a programmable (e.g., reconfigurable) digital filter 220 and digital noise shaper 230 that can be controlled via settings in the programmable structure control memory 250. Besides the order of filters, the structure of digital filter 220 and digital noise shaper 230 may include various other settings such as selection of an FIR or IIR structure, and particular ways for implementation of a filter, as examples. Selection of the structures for digital filter and digital noise shaper may be performed by setting one or more control bits in the programmable structure control memory 250. Since the control memories (e.g., programmable structure control memory 250 and programmable coefficient selection control memory 260) may require relatively small amount of storage, eFuse memory may be used which is compatible with standard low-cost logic processes, although any other suitable memory (e.g., non-volatile memory) may also be used.

Still referring to FIG. 3B, coefficient and structure selection unit 240 loads selected coefficients into digital filter 220 and digital noise shaper 230, in accordance with settings of one or more control bits in programmable coefficients selection control memory 260, in various embodiments. Different sets of coefficients may be pre-calculated and stored in a storage module, such as a digital filter and noise shaper coefficient read-only memory (ROM) 270 illustrated in FIG. 3B. As discussed earlier, the different sets of coefficients may provide different sensitivity scaling (e.g., gain adjustment), different frequency responses to equalize the analog channel, and different frequency bands of operation (e.g., audio band and ultra-sound band). The different sets of coefficients may be selected by setting one or more control bits in the programmable coefficient selection control memory 260. Digital filter and noise shaper coefficient ROM 270 may be an hard coded ROM, in some embodiments, although other suitable storage/memory modules (e.g., non-volatile memory) may also be used for storing the coefficients. Based on the settings of programmable coefficient selection control memory 260, coefficient and structure selection unit 240 fetches the selected coefficients from digital filter and noise shaper coefficient ROM 270, and loads the selected coefficients into digital filters 220 and/or digital noise shaper 230, in some embodiments.

FIG. 8 illustrates the NTF of digital noise shaper 230 with two different sampling clock frequencies of 3.072 MHz and 1.536 MHz. The frequency response (in terms of absolute frequency value of Hz instead of normalized digital frequency) of a digital filter is clock frequency dependent. As shown in the example of FIG. 8, when the sampling frequency is reduced by half, the frequency response scales (e.g., shrinks) accordingly (e.g., by half) along the frequency axis. Clock frequency (e.g., sampling clock frequency) in digital systems may drift from the nominal value due to, e.g., temperature change of the crystal used in the clock generation circuit, and/or aging of electrical components. In addition, the digital system (e.g., the digital SiMIC system) may operate under different clock frequencies on purpose to achieve different performance target, e.g., high-performance mode (with high clock frequency) or low-power mode (with low clock frequency).

Referring to FIG. 3B, to support the different operation modes and/or to address the clock frequency drifting issue, digital logic 200 includes a clock frequency monitor 280 (also referred to as clock frequency detection unit 280), in some embodiments. Clock frequency monitor 280 detects and/or monitors the system clock frequency CLK, e.g., by comparing CLK with a reference clock signal, which may be an on-chip reference clock that is commonly available.

Figure 9:
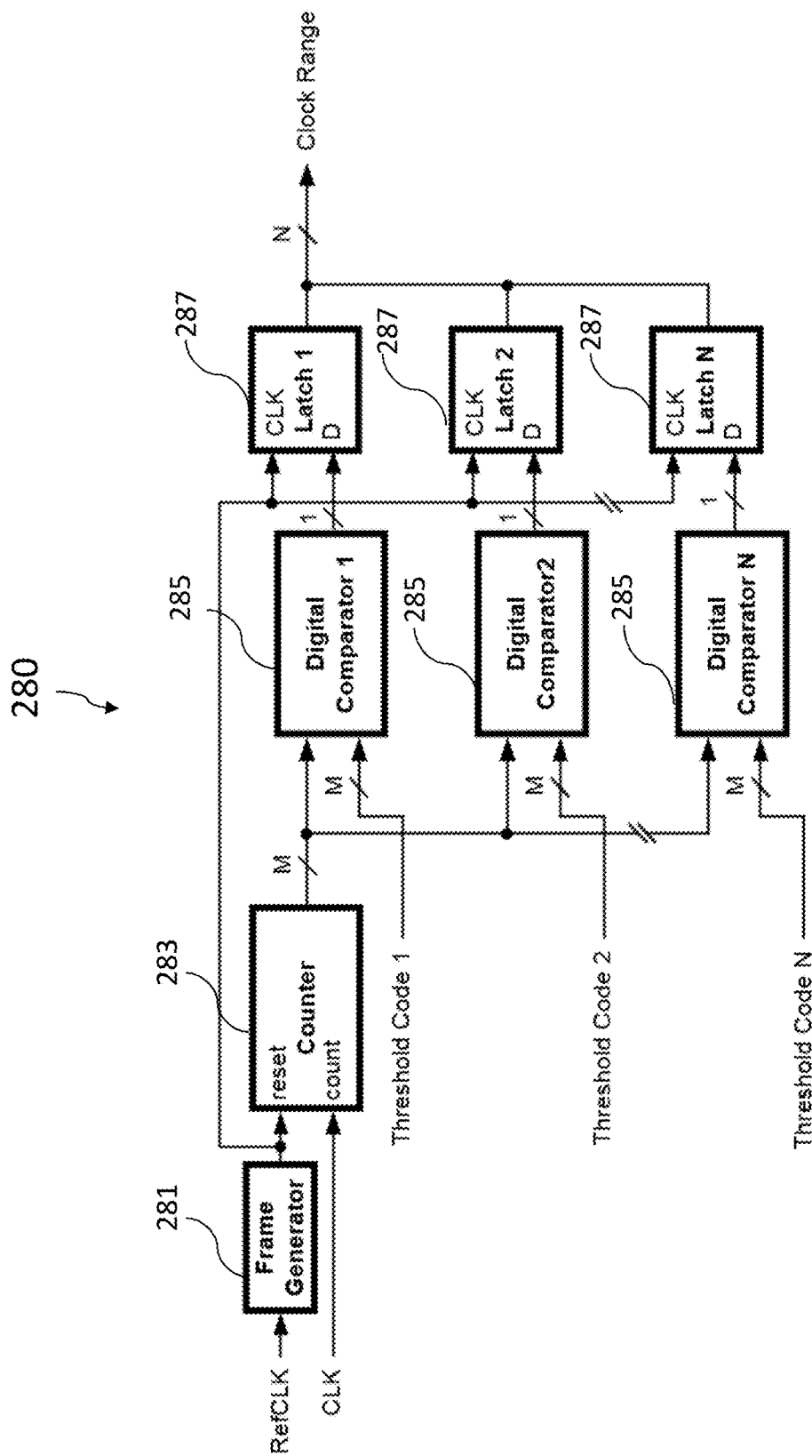
FIG. 9 illustrates a block diagram of a clock frequency detection unit, in some embodiments.

FIG. 9 illustrates an embodiment clock frequency detection unit 280. As illustrated in FIG. 9, a frame generator 281 sets a time frame for performing the clock frequency detection, e.g., by counting a pre-determined number of clocks cycles of the reference clock RefCLK. Counter 283 counts the number of clock cycles of clock frequency CLK within the time frame. The output of counter 283 is compared with N threshold values using N digital comparators 285, and the comparator outputs, each of which may be a one-bit value, are latched by latches 287 and are combined to form a N-bit word to represent the detected clock range.

Based on the output of clock frequency detection unit 280, coefficients that correspond to the detected clock frequency are loaded into digital filter 220 and digital noise shaper 230, thereby ensuring that digital filter 220 and digital noise shaper 230 have the desired frequency response for improved system performance, and ensuring that stability of digital filter 220 and digital noise shaper 230 are maintained, in some embodiments. In other embodiments, the SiMIC system is configured to automatically switch between different operation modes, e.g., high-performance mode and low-power mode, by using the detected clock frequency as indication of which operation mode is selected. The configurations of digital filter 220 and digital noise filter 230 may be set automatically in response to the detected clock frequency.

Digital logic 200 in FIG. 3B produces a one-bit digital stream at the output of digital noise shaper 230 for interfacing with devices or modules supporting a one-bit interface. Digital logic 200 in FIG. 3A may produce a multi-bit output at the output of digital interface unit 230 for interfacing with devices or modules that support a multi-bit data interface (e.g., the SoundWire Interface), in which case digital filter 220 may include a first digital filter coupled to a decimator filter. The first digital filter may be or include a filter similar to digital filter 220 in FIG. 3B, which performs filtering and equalization on the input data (e.g., data from multi-bit delta-sigma modulator 150 or at the output of code mapping unit 210). Output of the first digital filter is sent to the decimation filter, which reduces the data rate by a decimator factor (e.g., a configurable decimation factor), in some embodiments. The output of the decimation filter is scaled by a gain adjustment unit (e.g., a multiplier), in some embodiments. Decimation filter is well known in the art and details are not repeated. The output of digital filter 220 is sent to digital interface unit 230, which may include a configurable digital logic for converting the data format of the output of digital filter 220 into a per-determined multi-bit data format (e.g., SoundWire data format). The configurable digital interface unit 230 may be or include a digital filter, and the structure (e.g., order of the filter) and/or coefficients of the digital filter may be reconfigurable. Embodiments of digital logics 200 in FIGS. 3A and 3B advantageously provide flexibility to DiMIC system 100 for interfacing with either single-bit or multi-bit devices or modules.

Figure 10:
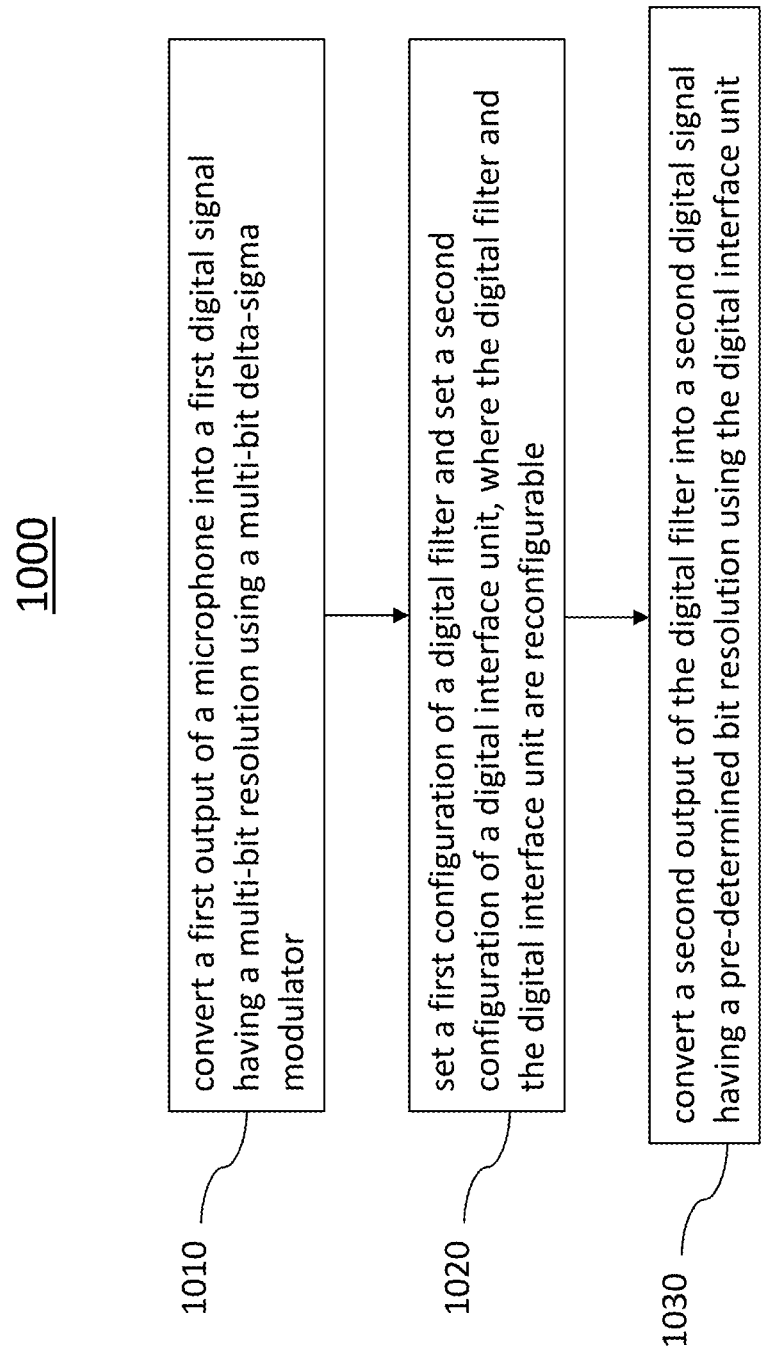
FIG. 10 illustrates a flow diagram for a method of operating a reconfigurable microphone system, in some embodiments.

FIG. 10 illustrates a flow chart of a method of operating a reconfigurable microphone system, in accordance with some embodiments. It should be understood that the embodiment methods shown in FIG. 10 is an example of many possible embodiment methods. One of ordinary skill in the art would recognize many variations, alternatives, and modifications. For example, various steps as illustrated in FIG. 10 may be added, removed, replaced, rearranged and repeated.

Referring to FIG. 10, at step 1010, a first output of a microphone is converted into a first digital signal having a multi-bit resolution using a multi-bit delta-sigma modulator. At step 1020, a first configuration of a digital filter is set and a second configuration of a digital interface unit is set, where the digital filter and the digital interface unit are reconfigurable. At step 1030, a second output of the digital filter is converted into a second digital signal having a pre-determined bit resolution using the digital interface unit.

A general aspect of the present disclosure includes a microphone system including a multi-bit delta-sigma modulator configured to be coupled to a microphone and configured to covert an output of the microphone into a first digital signal with a multi-bit resolution at a first output of the multi-bit delta-sigma modulator. The microphone system also includes a digital noise shaper coupled to the first output of the multi-bit delta-sigma modulator, and configured to convert a multi-bit digital input of the digital noise shaper into a one-bit digital signal.

Implementations may include one or more of the following features. The microphone system further includes a microphone. The microphone system further includes a digital filter coupled between the multi-bit delta-sigma modulator and the digital noise shaper, with an input of the digital filter coupled to the first output of the multi-bit delta-sigma modulator and an output of the digital filter coupled to an input of the digital noise shaper. The digital filter of the microphone system is configured to equalize the first digital signal. The microphone system further includes a code mapping module coupled between the multi-bit delta-sigma modulator and the digital filter.

In some embodiments, the digital noise shaper of the microphone system is a one-bit delta-sigma modulator configured to produce a one-bit output. A first configuration of the digital filter and a second configuration of the digital noise shaper are reconfigurable, in various embodiments. At least one of the first configuration and the second configuration includes a gain, an order of a filter, and a set of coefficients, in accordance with an embodiment.

In some embodiments, the digital filter of the microphone system is configured to provide a low-pass frequency response around a higher end of an audio frequency band with a first setting for the first configuration, and the digital filter is configured to provide a frequency boost above a higher end of the audio frequency band with a second setting for the first configuration. The microphone system may further include a configuration selection unit configured to set the first configuration of the digital filter and the second configuration of the digital noise shaper in accordance with a performance requirement of the microphone system. The microphone system may further include a storage unit configured to store different sets of coefficients of the digital filter and the digital noise shaper, and a control interface configured to control the configuration selection unit. The microphone system may further include a clock frequency detection unit configured to detect a frequency of a clock signal of the microphone system, where a detection result of the clock frequency detection unit is used to set the first configuration of the digital filter and the second configuration of the digital noise shaper. In an embodiment, the multi-bit delta-sigma modulator, the digital filter, the digital noise shaper, the configuration selection unit, the storage unit and the control interface are integrated on a same semiconductor substrate.

Another general aspect of the present disclosure includes a semiconductor device including a multi-bit delta-sigma modulator configured to convert an output voltage of a microelectromechanical systems (mems) microphone into a first digital signal with a multi-bit resolution, and a digital logic coupled to the multi-bit delta-sigma modulator. The digital logic includes a digital filter configured to equalize the first digital signal and having a reconfigurable configuration, and a digital interface unit configured to convert an output of the digital filter into a second digital signal with a pre-determined data format.

Implementations may include one or more of the following features. The pre-determined data format includes a multi-bit data format. A configuration of the digital interface unit is reconfigurable. The digital interface unit is a digital noise shaper configured to convert the output of the digital filter into a one-bit data stream. The digital filter suppresses frequency components of the first digital signal that are above an audio frequency band with a first setting of the configuration of the digital logic, and the digital filter enhances frequency components of the first digital signal that are within an ultra-sound frequency band with a second setting of the configuration of the digital logic. The digital logic further includes a code mapping module between the multi-bit delta-sigma modulator and the digital filter, where the code mapping module is configured to convert the first digital signal from a first format into a second format prior to being processed by the digital filter.

In some embodiments, the digital logic further includes a storage unit configured to store first sets of coefficient for the digital filter and second sets of coefficients for the digital interface unit, where at least one of the first sets of coefficients and the second sets of coefficients are configured to support different sensitivity requirements of the microphone. The digital logic also includes a configuration module configured to load different sets of coefficients into at least one of the digital filter and the digital interface unit in accordance with the different sensitivity requirements, and a control interface for setting the sensitivity requirement of the microphone. In an embodiment, at least one of the first sets of coefficients and the second sets of coefficients are configured to provide different frequency responses in accordance with frequency bands of operation of the microphone. The digital logic may further include a clock frequency monitor unit configured to detect a frequency of a clock signal of the semiconductor device. In various embodiments, the configuration module is configured to change coefficients of the digital filter and coefficients of the digital interface unit in accordance with a detected frequency from the clock frequency monitor unit.

In accordance with another general aspect of the present disclosure, a method of operating a reconfigurable microphone system includes converting a first output of a microphone into a first digital signal having a multi-bit resolution using a multi-bit delta-sigma modulator, setting a first configuration of a digital filter and setting a second configuration of a digital interface unit, where the digital filter and the digital interface unit are reconfigurable, and converting a second output of the digital filter into a second digital signal having a pre-determined bit resolution using the digital interface unit.

Implementations may include one or more of the following features. The method further includes in response to a change in a performance requirement of the microphone, setting a third configuration for the digital filter and a fourth configuration for the digital interface unit. The performance requirement includes microphone sensitivity, a frequency band of operation for the microphone, and a frequency of a clock signal of the reconfigurable microphone system. The setting the first configuration of the digital filter includes setting at least one of the order of the digital filter and the coefficients of the digital filter. The setting the second configuration of the digital interface unit includes setting at least one of the order of the digital interface unit and the coefficients of the digital interface unit. The method further includes equalizing the first digital signal using the digital filter.

In some embodiments, the equalizing includes applying a first gain for components of the first digital signal at a first frequency, and applying a second gain different from the first gain for components of the first digital signal at a second frequency. The digital interface unit is a digital noise shaper, where the digital noise shaper reshapes a quantization noise of the digital noise shaper such that energy of the quantization noise outside a band of interest is higher than the energy of the quantization noise inside the band of interest, in some embodiments. The method further includes monitoring a frequency of a clock signal of the reconfigurable microphone system, and in response to a change in the frequency of the clock signal, setting a third configuration for the digital filter and a fourth configuration for the digital interface unit, in various embodiments.

Advantages of embodiments of the present invention include improved digital SiMIC system performance and the ability to use the same digital silicon microphone in different systems with different performance requirements. The multi-bit delta-sigma modulator significantly lowers quantization noise and allows a lower order (e.g., $3^{rd}$ order) multi-bit delta-sigma modulator to be used, thus improving the stability of the SiMIC systems and achieving high SNR and dynamic range. By modifying the order and the coefficients of the reconfigurable digital filters, different sensitivity scaling can be provided in the digital domain to accommodate different sensitivity requirements, and the system SNR is independent of sensitivity at high OSR and only deteriorate slightly at low OSR. In addition, the frequency response of the digital filter can be adjusted to equalize the analog channel to preserve or enhance the in-band signal (e.g., audio signal or ultra-sound signal) while filtering or attenuating out-of-band noise and inferences. Different frequency bands of operation (e.g., audio band or ultra-sound band) can be supported by using different structures and coefficients for the digital filter. The one-bit output of the digital noise shaper allows interfacing with a simple decoding circuit such as a decimation filter or an audio codec host. In the case of multi-bit interface at the output of digital logic 200, the output of the multi-bit interface may connect to other devices that support a multi-bit protocol, such as the SoundWire Standard. The clock frequency detection unit monitors the system clock frequency and selects the structure and the coefficients of the digital logic (e.g., the digital filter and the digital noise shaper) based on detected clock frequency, thereby ensuring system stability and proper frequency responses of the digital logic. High SNR (e.g., 66 dB) and a wide dynamic range (e.g., 112 dB) are achieved with the disclosed architecture.

Although the invention has been shown and described primarily in connection with specific exemplary embodiments, it should be understood by those skilled in the art that diverse changes in the configuration and the details thereof can be made without departing from the essence and scope of the invention as defined by the claims below. The scope of the invention is therefore determined by the appended claims, and the intention is for all alterations that lie within the range of the meaning and the range of equivalence of the claims to be encompassed by the claims.

What is claimed is:

1. A microphone system comprising:
    a multi-bit delta-sigma modulator configured to be coupled to a microphone and configured to covert an output of the microphone into a first digital signal with a multi-bit resolution at a first output of the multi-bit delta-sigma modulator;
    a digital noise shaper coupled to the first output of the multi-bit delta-sigma modulator, and configured to convert a multi-bit digital input of the digital noise shaper into a one-bit digital signal;
    a digital filter coupled between the multi-bit delta-sigma modulator and the digital noise shaper, with an input of the digital filter coupled to the first output of the multi-bit delta-sigma modulator and an output of the digital filter coupled to an input of the digital noise shaper; and
    a code mapping module coupled between the multi-bit delta-sigma modulator and the digital filter.

2. The microphone system of claim 1, further comprising a microphone.

3. The microphone system of claim 1, wherein the digital filter is configured to equalize the first digital signal.

4. The microphone system of claim 1, wherein the digital noise shaper is a one-bit delta-sigma modulator configured to produce a one-bit output.

5. The microphone system of claim 4, wherein a first configuration of the digital filter and a second configuration of the digital noise shaper are reconfigurable.

6. The microphone system of claim 5, wherein at least one of the first configuration and the second configuration comprises a gain, an order of a filter, and a set of coefficients.

7. The microphone system of claim 6, wherein the digital filter is configured to provide a low-pass frequency response around a higher end of an audio frequency band with a first setting for the first configuration, and wherein the digital filter is configured to provide a frequency boost above a higher end of the audio frequency band with a second setting for the first configuration.

8. The microphone system of claim 7, further comprising a configuration selection unit configured to set the first configuration of the digital filter and the second configuration of the digital noise shaper in accordance with a performance requirement of the microphone system.

9. The microphone system of claim 8, further comprising:
    a storage unit configured to store different sets of coefficients of the digital filter and the digital noise shaper; and
    a control interface configured to control the configuration selection unit.

10. The microphone system of claim 9, further comprising a clock frequency detection unit configured to detect a frequency of a clock signal of the microphone system, wherein a detection result of the clock frequency detection unit is used to set the first configuration of the digital filter and the second configuration of the digital noise shaper.

11. The microphone system of claim 10, wherein the multi-bit delta-sigma modulator, the digital filter, the digital noise shaper, the configuration selection unit, the storage unit and the control interface are integrated on a same semiconductor substrate.

12. A semiconductor device comprising:
- a multi-bit delta-sigma modulator configured to convert an output voltage of a microelectromechanical systems (MEMS) microphone into a first digital signal with a multi-bit resolution; and
- a digital logic coupled to the multi-bit delta-sigma modulator, the digital logic having a configuration that is reconfigurable, the digital logic comprising:
  - a digital filter configured to equalize the first digital signal and having a reconfigurable configuration; and
  - a digital interface unit configured to convert an output of the digital filter into a second digital signal with a pre-determined data format, wherein a configuration of the digital interface unit is reconfigurable;
- a storage unit configured to store first sets of coefficient for the digital filter and second sets of coefficients for the digital interface unit, wherein at least one of the first sets of coefficients and the second sets of coefficients are configured to support different sensitivity requirements of the microphone;
- a configuration module configured to load different sets of coefficients into at least one of the digital filter and the digital interface unit in accordance with the different sensitivity requirements; and
- a control interface for setting the sensitivity requirement of the microphone.

13. The semiconductor device of claim 12, wherein the pre-determined data format comprises a multi-bit data format.

14. The semiconductor device of claim 12, wherein the digital interface unit is a digital noise shaper configured to convert the output of the digital filter into a one-bit data stream.

15. The semiconductor device of claim 12, wherein
- the digital filter suppresses frequency components of the first digital signal that are above an audio frequency band with a first setting of the configuration of the digital logic; and
- the digital filter enhances frequency components of the first digital signal that are within an ultra-sound frequency band with a second setting of the configuration of the digital logic.

16. The semiconductor device of claim 12, wherein the digital logic further comprises a code mapping module between the multi-bit delta-sigma modulator and the digital filter, wherein the code mapping module is configured to convert the first digital signal from a first format into a second format prior to being processed by the digital filter.

17. The semiconductor device of claim 12, wherein at least one of the first sets of coefficients and the second sets of coefficients are configured to provide different frequency responses in accordance with frequency bands of operation of the microphone.

18. The semiconductor device of claim 17, wherein the digital logic further comprises a clock frequency monitor unit configured to detect a frequency of a clock signal of the semiconductor device.

19. The semiconductor device of claim 18, wherein the configuration module is configured to change coefficients of the digital filter and coefficients of the digital interface unit in accordance with a detected frequency from the clock frequency monitor unit.

20. A method of operating a reconfigurable microphone system comprising:
- converting a first output of a microphone into a first digital signal having a multi-bit resolution using a multi-bit delta-sigma modulator;
- setting a configuration of a digital filter and setting a configuration of a digital interface unit, wherein the digital filter and the digital interface unit are reconfigurable;
- equalizing the first digital signal using the digital filter, wherein the equalizing comprises:
  - applying a first gain for components of the first digital signal at a first frequency; and
  - applying a second gain different from the first gain for components of the first digital signal at a second frequency; and
- converting an output of the digital filter into a second digital signal having a pre-determined bit resolution using the digital interface unit.

21. The method of claim 20, further comprising:
- in response to a change in a performance requirement of the microphone, changing the configuration of the digital filter and changing the configuration of the digital interface unit.

22. The method of claim 21, wherein the performance requirement comprises microphone sensitivity, a frequency band of operation for the microphone, and a frequency of a clock signal of the reconfigurable microphone system.

23. The method of claim 20, wherein the setting the configuration of the digital filter comprises setting at least one of an order of the digital filter and coefficients of the digital filter.

24. The method of claim 23, wherein the setting the configuration of the digital interface unit comprises setting at least one of an order of the digital interface unit and coefficients of the digital interface unit.

25. The method of claim 20, wherein the digital interface unit is a digital noise shaper, wherein the digital noise shaper reshapes a quantization noise of the digital noise shaper such that energy of the quantization noise outside a band of interest is higher than the energy of the quantization noise inside the band of interest.

26. The method of claim 20, wherein the method further comprises:
- monitoring a frequency of a clock signal of the reconfigurable microphone system; and
- in response to a change in the frequency of the clock signal, changing the configuration of the digital filter and changing the configuration of the digital interface unit.

\* \* \* \* \*